(12) United States Patent
Belaidi et al.

(10) Patent No.: US 8,006,208 B2
(45) Date of Patent: Aug. 23, 2011

(54) REDUCING COUPLING BETWEEN WIRES OF AN ELECTRONIC CIRCUIT

(75) Inventors: Moussadek Belaidi, Fishkill, NY (US); Markus Buehler, Schoenbuch (DE); James J. Curtin, Fishkill, NY (US); Adam P. Matheny, Beacon, NY (US); Bryan A. Meyer, South Pasadena, CA (US); Douglas S. Search, Red Hook, NY (US); Dhaval R. Sejpal, Austin, TX (US); Charles Vakirtzis, New Windsor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/781,851

(22) Filed: May 18, 2010

(65) Prior Publication Data

US 2010/0223588 A1  Sep. 2, 2010

Related U.S. Application Data

(63) Continuation of application No. 11/845,852, filed on Aug. 28, 2007.

(30) Foreign Application Priority Data

Nov. 15, 2006  (DE) .................................... 06124167

(51) Int. Cl.
*G06F 17/50* (2006.01)
*G06F 9/455* (2006.01)
(52) U.S. Cl. ........................................ 716/115; 716/126
(58) Field of Classification Search .............. 716/12–14, 716/115, 126
See application file for complete search history.

(56) References Cited

U.S. PATENT DOCUMENTS

| | | | |
|---|---|---|---|
| 6,029,117 A | 2/2000 | Devgan |
| 6,327,542 B1 | 12/2001 | McBride |
| 6,480,998 B1 | 11/2002 | Mukherjee et al. |
| 6,499,131 B1 | 12/2002 | Savithri et al. |
| 6,507,935 B1 | 1/2003 | Aingaran et al. |
| 6,510,545 B1 | 1/2003 | Yee et al. |
| 6,772,403 B1 | 8/2004 | Sasaki |
| 7,181,711 B2 | 2/2007 | Foreman et al. |
| 2003/0115563 A1 | 6/2003 | Chen |
| 2003/0237066 A1 | 12/2003 | Ito |
| 2004/0098684 A1 | 5/2004 | Amekawa |
| 2004/0103386 A1 | 5/2004 | Becer et al. |
| 2004/0216073 A1 | 10/2004 | Elzinga et al. |
| 2005/0097498 A1 | 5/2005 | Yoda |
| 2005/0120316 A1 | 6/2005 | Suaya et al. |

(Continued)

FOREIGN PATENT DOCUMENTS

CN  1416082  5/2003

(Continued)

OTHER PUBLICATIONS

Office Action for U.S. Appl. No. 11/845,301, filed Aug. 27, 2007 dated Jan. 7, 2009.

(Continued)

*Primary Examiner* — Suresh Memula
(74) *Attorney, Agent, or Firm* — Gibb I.P. Law Firm, LLC

(57) ABSTRACT

A routing method for reducing coupling between wires of an electronic circuit is proposed, wherein sets of nets are classified according to their coupling characteristics, and spacing between wires assigned to the sets of nets is chosen according to the coupling characteristics.

19 Claims, 3 Drawing Sheets

| | D<br>w_default | V<br>w_default+2r | A<br>w_default+4r | VA<br>w_default+6r |
|---|---|---|---|---|
| D<br>w_default | s_default | s_default-r | s_default-2r | s_default-3r |
| V<br>w_default+2r | s_default-r | s_default-2r | s_default-3r+e | s_default-4r+e |
| A<br>w_default+4r | s_default-2r | s_default-3r+e | s_default-4r | s_default-5r+e |
| VA<br>w_default+6r | s_default-3r | s_default-4r+e | s_default-5r+e | s_default-6r+e |

U.S. PATENT DOCUMENTS

| | | |
|---|---|---|
| 2005/0132309 A1 | 6/2005 | Saxena et al. |
| 2005/0246671 A1 | 11/2005 | Bois et al. |
| 2006/0117289 A1 | 6/2006 | Katagiri |
| 2006/0248485 A1 | 11/2006 | Foreman et al. |
| 2006/0294485 A1 | 12/2006 | Kaul et al. |
| 2006/0294488 A1 | 12/2006 | Waller |
| 2007/0226673 A1 | 9/2007 | Habitz et al. |
| 2008/0028352 A1 | 1/2008 | Birch et al. |

FOREIGN PATENT DOCUMENTS

| | | |
|---|---|---|
| CN | 1472680 | 2/2004 |

OTHER PUBLICATIONS

Office Action for U.S. Appl. No. 11/845,301, filed Aug. 27, 2007 dated Jul. 24, 2009.

Office Action for U.S. Appl. No. 11/458,852, filed Aug. 28, 2007, dated Mar. 19, 2010.

Office Action for U.S. Appl. No. 11/845,852, Dated Sep. 2, 2010, filed Aug. 28, 2007, 27 pages.

Office Action: U.S. Appl. No. 11/845,852, Title: "An Integrated Circuit Design for Reducing Coupling Between Wires of an Electronic Circuit":, filed Aug. 28, 2007, Date Mailed: Dec. 28, 2010.

|     | D         | V           | A           | VA          |
| --- | --------- | ----------- | ----------- | ----------- |
| D   | s_default | s_default   | s_default   | s_default   |
| V   | s_default | s_default   | s_default+e | s_default+e |
| A   | s_default | s_default+e | s_default   | s_default+e |
| VA  | s_default | s_default+e | s_default+e | s_default+e |

Fig. 3

|                   | D<br>w_default | V<br>w_default+2r | A<br>w_default+4r | VA<br>w_default+6r |
| ----------------- | -------------- | ----------------- | ----------------- | ------------------ |
| D<br>w_default    | s_default      | s_default-r       | s_default-2r      | s_default-3r       |
| V<br>w_default+2r | s_default-r    | s_default-2r      | s_default-3r+e    | s_default-4r+e     |
| A<br>w_default+4r | s_default-2r   | s_default-3r+e    | s_default-4r      | s_default-5r+e     |
| VA<br>w_default+6r| s_default-3r   | s_default-4r+e    | s_default-5r+e    | s_default-6r+e     |

Fig. 4

REDUCING COUPLING BETWEEN WIRES OF AN ELECTRONIC CIRCUIT

CROSS-REFERENCE TO RELATED APPLICATIONS

The present invention claims the benefit under 35 U.S.C. §120 as a continuation of presently pending U.S. patent application Ser. No. 11/845,852 entitled "AN INTEGRATED CIRCUIT DESIGN FOR REDUCING COUPLING BETWEEN WIRES OF AN ELECTRONIC CIRCUIT, filed on Aug. 28, 2007, which is a continuation-in-part of abandoned U.S. patent application Ser. No. 11/845,301 filed on Aug. 28, 2007 which claims priority to German Patent Application No. 06124167.5, filed Nov. 15, 2006, the entire teachings of which are incorporated herein by reference.

FIELD OF THE INVENTION

The present invention relates to a design structure for reducing coupling between wires of an electronic circuit. In particular, the present invention relates to a design structure for reducing coupling between wires of an electronic circuit, wherein sets of nets are classified according to their coupling characteristics, and spacing between wires assigned to the sets of nets is chosen according to the coupling characteristics.

BACKGROUND OF THE INVENTION

There are many steps and processes involved producing microelectronic components such as computer processing units (CPUs) and application specific integrated circuits (ASICs), which are widely used in computers, cell phones, and portable electronics. Making electronics smaller and smaller raises new challenges in manufacturing CPUs and ASICs. Physical properties of the materials in semiconductor devices that previously did not affect the manufacturability or performance have become a major deterrent.

Designing modern electrical circuits such as CPUs and ASICs with wire dimensions of 130 nm and below has become increasingly difficult due to shrinking distance rules ("wire pitch") which cause capacitive coupling between proximate wires. Coupling describes an electromagnetic effect where a signal change in one wire (aggressor wire) can affect the signal in a proximate wire (victim wire). The aggressor wire can either cause the victim wire to change its static value for a certain time span, a so called "glitch", or it can cause a signal change in the victim wire to either speed up or slow down. In any case this can cause a digital system to fail because wrong signal values may be propagated.

Several approaches are known for eliminating the capacitive coupling between aggressor wires and victim wires.

The simplest approach to reduce coupling problems known in the art involves proceeding with standard routing and then fixing the problems with a post process, either manually or automatically. The standard routing would be done after timing closure based on the so called Steiner routes. Afterwards, the designer would do coupling analysis. Based on the analysis to avoid coupling problems logic changes are made by inserting repeaters or resized drivers in victim nets (the data representation of a wire in the design tools chain) and victim wires and optionally aggressor wires are rerouted with extra space using an isolated wire type.

The drawbacks are that the logic changes require the design infrastructure to support the ability to modify cells on routed designs. In the worst case, there is no solution, because adding additional buffers to timing critical nets can add too much delay or large enough drivers may not exist. Adding extra space consumes a lot of wiring resources and can have the side effect of causing detours, opens, or unwirability. If the extra space were a soft requirement, perhaps no detours or opens would be generated. However, the original issues would not be solved, especially in congested regions where coupling issues are most likely to occur.

Another approach, for example, involves routing all nets with a recommended extra space. As in the approach described above, a post processing is still required.

An automated method for analyzing crosstalk between wires is disclosed in the U.S. Pat. No. 6,507,935 B1. For at least one potential victim wire of a plurality of wires, a subset of the wires of the chip are found to be potential aggressor wires to the victim wire. An alarm threshold for each potential victim wire is determined and is compared to a calculated height of a coupled noise on the victim wire to determine which wires of the design suffer enough crosstalk noise that they should be redesigned. A similar approach is disclosed in the U.S. Pat. No. 6,327,542 B1, which proposes a method for determining an aggressor coupling capacitance and the coupling voltage noise. Both disclosures, however, suggest analyzing the crosstalk between the wires of a net. A post processing of the net is necessary, if the crosstalk level is too high.

A method for avoiding crosstalk between wires is disclosed in the U.S. Pat. No. 6,510,545 B1. Reducing the crosstalk is accomplished by introducing VDD and VSS wires proximate to signal wires on the same metal layer which reduce the crosstalk by shielding the signal wires. Such shields are implemented on all the wires of the net. Shields are deleted in areas where they are considered to be unnecessary. Although an efficient method to avoid crosstalk is suggested, the method is expensive and can practically only be applied to a small number of nets.

It is therefore an object of the invention to provide an improved routing method which allows for reducing coupling between wires in electronic circuits in a cost efficient way, thus avoiding unnecessary post processing, and corresponding computer programs, computer program products and computer systems.

The objects of the invention are achieved by the features of the independent claims. The other claims and the description disclose advantageous embodiments of the invention.

SUMMARY OF THE INVENTION

According to the invention, a design structure for reducing coupling between wires of an electronic circuit is proposed, wherein sets of nets are classified according to their coupling characteristics, and spacing between wires assigned to the sets of nets is chosen according to the coupling characteristics.

Advantageously, capacitive coupling between the wires in electronic circuits can be reduced substantially or even be eliminated while preserving as many wiring resources as possible. The method requires only few routing resources, less than the known approaches. Wire spacing is required only when necessary. By isolating victim wires from all their aggressors, a root problem of coupling issues is solved. Signal nets can be placed adjacent to other "safe" nets. Default nets can be next to all other nets, victim nets can be next to other victim nets and aggressor nets can be next to other aggressor nets.

A user can update the technology files, usually used in design and/or routing, that define wire spacing requirements without the need of introducing any changes to the router source algorithms or source code. As such, this is runtime efficient: no on-the-fly checks are required, since coupling avoidance is defined in the technology rules. Such technology files serve as special input for routing programs. The technology files provide concrete design rules for each concrete (hardware) implementation process, for example various CMOS (Complementary Metal Oxide Semiconductor) technologies. The technology files are necessary for generic routing programs to be able to support the specific process.

The invention can be combined with other existing approaches for reducing the coupling. Most if not all routers optimize their capability to deal with new wire types or spacing rules to anticipate new technologies and changing customer and manufacturing requirements. The effectiveness of the capacitive coupling reduction can be measured by the amount of coupling parasitics present on the wire signals before and after the special wire types with customized spacing rules have been applied.

Preferably, the electronic circuit for which the routing method is employed is adopted in an electronic device, such as a CPU or an ASIC or a printed circuit board. Most preferred is the electronic device based on a sub-micron technology with a wire pitch of at most ca. 400 nm According to a preferred embodiment, at least one set of nets is classified as a victim set, which contains nets, preferably all nets, that are classified victims to one or more coupling issues, and at least one set of nets as an aggressor set, which contains nets, preferably all nets, that are classified aggressors of one or more coupling issues, and specific distance rules are applied to the different sets of nets.

Reasonably, at least one victim-aggressor set, which contains nets, preferably all nets, that are classified victims and aggressors of one or more coupling issues, and/or a default set, which contain nets, preferably all nets, which are insensitive to coupling issues, are introduced additionally.

For implementation of the sets of nets in a lay-out of the electronic circuit, wire types are assigned to a specific set of nets. Preferably, the wires are arranged two-dimensionally in multiple layers.

Favorably, spacing between proximate wires is chosen depending on their specific wire types. Additional spacing is only provided if necessary.

Preferably, a first distance rule between a first wire and a second wire is applied, which second wire is proximate to the first wire unless:
  the first wire is a victim wire and the second wire is an aggressor wire or a victim-aggressor wire, or
  the first wire is an aggressor wire and the second wire is a victim wire or a victim-aggressor wire, or
  the first wire is a victim-aggressor wire and the second wire is a victim wire or an aggressor wire or a victim-aggressor wire;
  where for these cases a second distance rule is applied.

Spacing between proximate wires is preferably increased to avoid coupling. Reasonably, the spacing is increased if one of two or both proximate wires cause coupling in its neighbor.

Another preferred embodiment is preferably applied if the router program in use is not restricted to supporting only spacing based on wire widths. In practice, in a typical design 99% of the wires are of equal width. The method described also works with wires of varying widths.

In this embodiment, minimum space consumption can be achieved if with the first distance rule a minimum space is chosen as a first spacing. This space is preferably equal to the minimum space requirement for the specific manufacture technology which will be employed for the manufacture of the electronic circuit.

With the second distance rule an extra space is added to the first spacing yielding a second spacing. Additional space is only provided where necessary. Wires of "safe" wire types, which do not cause coupling issues, can be arranged next to each other.

According to another preferred embodiment, wire widths are assigned to at least two wire types. Preferably all wire types differ in their respective widths, wherein the widths are representative for each specific wire type. This is preferably applied if the router program supports only spacing based on wire widths.

Preferably, the widths increase in the same order of default wire types, victim wire types, aggressor wire types, victim-aggressor wire types as a spacing requirement decreases between wires of the same type, yielding a constant wire pitch for routing for each net. The default widths and default spacings can be specific for each net. In practice, default widths as well as default spacings of different nets usually are the same for the majority of nets.

The wire widths can preferably increase by an even-numbered multiple of a router resolution. Reasonably, the resolution is much smaller than a default width applied to the wires. For routing purposes, one specific wire type can be reliably distinguished from the other wire types by a slight difference in its wire width compared to the other wire widths.

Preferably a spacing between wires decreases from default wire to victim wire to aggressor wire to victim-aggressor wire types, if the first wire is of default wire type.

For example, the wire widths can increase from default wire to victim wire to aggressor wire to victim-aggressor wire types whereas the spacing requirement between wires of the same wire type decreases from default to victim to aggressor to victim-aggressor wire types, where favorably the spacing requirement decreases by an even-numbered multiple of a router resolution.

With the first distance rule, wire spacing is decreasing in units of the router resolution. The spacing between proximate default wires is preferably the default spacing resulting from the technology used for manufacturing the respective electronic circuit.

With the second distance rule, an additional spacing is added to the first wire spacing.

Additional types of victim and aggressor nets can be included. The distance and/or wire widths rules can be adapted to save additional wiring resources.

To avoid detours on important signals, it is possible to apply a weighing function to at least one timing critical net in all proposed embodiments. As timing is important for the performance of the electronic circuit, this allows prioritizing the net or nets which are critical for the timing.

Most preferably, routing is performed with the steps of
  defining sets of nets of different kinds, especially default nets, victim nets, aggressor nets and victim aggressor nets,
  perform global routing of the electronic circuit,
  run a coupling analysis,
  assign wire types to the kinds of nets, especially assign default wire types to default nets, victim wire types to victim nets, aggressor wire types to aggressor nets and victim-aggressor wire types to victim-aggressor nets,
  perform local routing,
  run a coupling analysis based on the local routing results,
  assign wire types to the kinds of nets, rip-up and reroute new wire types, allowing rip-up of others, repeat routing and assigning steps if necessary, reset wire widths to original widths, if wire widths have been changed for routing, return from routing.

This makes sure that at least for mask generation after the routing process the wire widths are reset to their original values.

BRIEF DESCRIPTION OF THE DRAWINGS

The present invention together with the above-mentioned and other objects and advantages may best be understood from the following detailed description of the embodiments, but not restricted to the embodiments, wherein is shown in:

FIG. 3 a table indicating distance rules for wire types according to a first embodiment of the invention;

FIG. 4 a table indicating distance rules for wire types according to a second embodiment of the invention.

DETAILED DESCRIPTION

Figure 1:
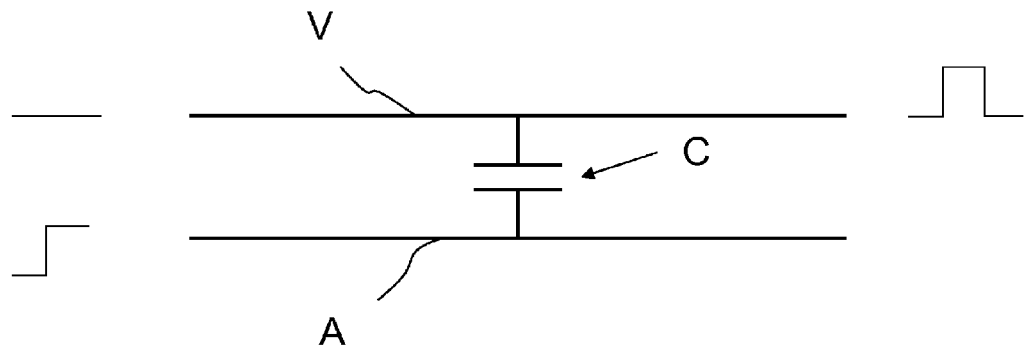
FIG. 1 a coupling issue between an aggressor wire and a victim wire.

FIG. 1 schematically depicts a coupling issue between an aggressor wire A and a victim wire V. A capacitive coupling issue between the two wires A and V is indicated by a capacitor C.

A step like signal is applied to the aggressor wire A as indicated on the left side of the figure. The signal couples into the victim wire V yielding a pulse signal which falsifies the state of the victim wire V.

Figure 2A:
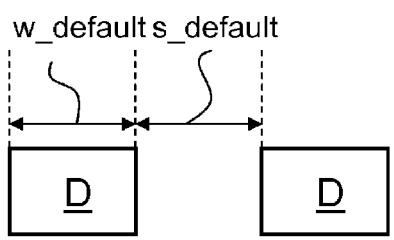
FIG. 2a-b default widths and default spacings (a) and spacings where a distance rule has been applied according to a first embodiment of the invention.
Figure 2B:
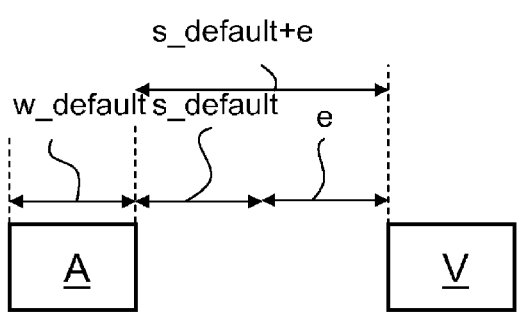

As depicted in the FIGS. 2a and 2b, a default wire D is assigned a default width w_default and a default spacing s_default to a proximate default wire D (FIG. 2a). The width and the spacing typically are a result of the actual technology files applied for a certain electronic circuit under development. As known in the art, those technology files typically comprise requirements for minimum wire widths, minimum spacings and other parameters which may be influenced by deposition and/or etching techniques, mask design, the specific layer of the wiring etc., which are applied in the fabrication technology of the device.

FIG. 2b depicts an aggressor wire A proximate to a victim wire V, where an additional spacing e has been introduced between the two wires to increase their distance and to reduce the coupling from the aggressor wire A to the victim wire V, where, for example, the new spacing is s_default+e. Reasonably, e can be of the same size as the width and/or the spacing. For example, for a CMOS 130-nm technology, the value for default width and default spacing is 200 nm each and e is 400 nm, yielding a new spacing of 600 nm. However, other values for e are possible, if required.

According to the invention, sets of nets are classified in four types of nets according to their coupling characteristics.

One set of nets is classified as a victim set, which contains nets that are classified victims to one or more coupling issues. One set of nets is classified as an aggressor set, which contains nets that are classified aggressors of one or more coupling issues. One set of nets is classified as a victim aggressor set, which contains nets that are classified victims and aggressors of one or more coupling issues. One set of nets is classified as a default net, which contain nets which are insensitive to coupling issues. As well known in the art, a net is a logical connection between a signal source and one of more elements receiving the signal. Such nets are implemented as wires in an electronic circuit such as an integrated circuit or a printed circuit board or the like.

Specific distance rules are applied to the different sets of nets which take into account the coupling issues between the different sets of nets.

For implementation of the set of nets in a layout of the electronic circuit, wire types V, A, VA, D are assigned to a specific set of nets. A default wire type D is assigned to the default net, a victim wire type is assigned to the victim nets, an aggressor wire type A is assigned to the aggressor nets, and a victim-aggressor wire type VA is assigned to the victim-aggressor nets. Spacing between proximate wires is chosen depending on their specific wire types. The assigned wire types V, A, VA, D are used by the router program.

Thus, a first distance rule between a first wire and a second wire is applied, which second wire is proximate to the first wire unless:

the first wire is a victim wire V and the second wire is an aggressor wire A or a victim-aggressor wire VA, or the first wire is an aggressor wire A and the second wire is a victim-aggressor wire VA, or the first wire is a victim-aggressor wire VA and the second wire is a victim wire V or an aggressor wire A or a victim-aggressor wire VA, where for these cases a second distance rule is applied.

The table in FIG. 3 exemplifies a first preferred embodiment of the invention. All wire types V, A, AV, D typically are of equal width. This embodiment is appropriate if the router program supports not only spacing based on wire widths, such as the router program known under the name Bonnroute by the International Business and Machines Corporation, for example.

In this example, according to the first distance rule a minimum space d is chosen as a first spacing s1 and with the second distance rule an extra space e is added to the first spacing s1, with s1=d, yielding a second spacing s2, with s2=d+e. Normally, e is a positive number e>0.

As can be seen in the table, the spacing between the default wire type D and all other wire types V, A, VA is equal and preferably the default space d which is usually the minimum space required by the technology used for the fabrication of the electronic device.

The spacing between a victim wire V and a default wire can be d, whereas the spacing between a victim wire V and an aggressor wire A as well as a victim aggressor wire VA has to be larger with d+e.

The spacing between an aggressor wire A and a default wire D as well as an aggressor wire A can be d, whereas the spacing between the aggressor wire A and a victim wire V as well as a victim-aggressor wire VA has to be larger with d+e.

The spacing between a victim-aggressor wire VA and a default wire D can be d, whereas to all other wire types the spacing has to be larger with d+e.

For such router programs which only support spacing based on wire widths, all wire types V, A, AV, D differ in their respective widths, wherein the widths are representative for each specific wire type V, A, AV, D. For example, such a router program is known under the name of Nanoroute by Cadence. Thus, the different wire types can be emulated by using slight differences in wire widths to represent the different wire types V, A, AV, D.

Let w_default represent a default width, s_default represent a default spacing, r represent the resolution of the router program, and assume that the resolution is much smaller than the default width w_default, w_default>>r.

Suppose W(x) is the width of a wire x, and S(x) is the spacing requirement for the wire x. Widths W(x) and spacing requirements S(x) for default wires D, victim wires V, aggressor wires A, and victim-aggressor wires VA can be defined as follows:

$$W(D) = w\_default$$

$$W(V) = w\_default + 2r$$

$$W(A) = w\_default + 4r$$

$$W(VA) = w\_default + 6r$$

and $$S(D) = s\_default$$

$$S(V) = s\_default - 2r$$

$$S(A) = s\_default - 4r$$

$$S(VA) = s\_default - 6r$$

As can be seen, the widths W(x) increase from default wire D to victim wire V to aggressor wire A to victim-aggressor wire VA types, wherein the widths increase by an even-numbered multiple of the router resolution r. Preferably, the values for width and spacing are chosen to maintain the original wire pitch, i.e. w_default+s_default and w_default+s_default+e, respectively (FIG. 3). After the routing has been done, preferably for extraction but at least for mask generation, the wire widths should be reset to their original values w_default.

In contrast to the widths W(x), the spacing requirement S(x) decreases from default D to victim V to aggressor A to victim-aggressor wire VA types, wherein the spacing requirement S(x) decreases by an even-numbered multiple of the router resolution r.

A table can be generated similar to the table in FIG. 3 for the first embodiment, as is depicted by the table in FIG. 4.

Again, a first distance rule between a first wire and a second proximate wire is applied, unless
  the first wire is a victim wire V and the second wire is an aggressor wire A or a victim-aggressor wire VA, or
  the first wire is an aggressor wire A and the second wire is a victim-aggressor wire VA, or
  the first wire is a victim-aggressor wire VA and the second wire is a victim wire V or an aggressor wire A or a victim-aggressor wire VA,
  where for these cases a second distance rule is applied.

With the first distance rule a wire spacing s3 is applied, which is decreasing in units of the router resolution, starting form the default spacing s_default between two proximate default wires D. With the second distance rule an additional spacing e is added to the first wire spacing s3.

With the first wire a default wire D, the spacing to a proximate victim wire is s_default−r, the spacing to a proximate aggressor wire A is s_default−2r and to a proximate victim-aggressor wire VA is s default−3r.

If the first wire is a victim wire V and the proximate wire is a default wire D, the spacing is s_default−r, with the proximate wire being a victim wire V, the spacing is s_default−2r, with the proximate wire an aggressor wire A, the spacing is s_default−3r+e, and with the proximate wire a victim-aggressor wire VA, the spacing is s_default−4r+e.

If the first wire is an aggressor wire A and the proximate wire is a default wire D, the spacing is s_default−2r, with the proximate wire a victim wire V, the spacing is s_default−3r+e, with the proximate wire an aggressor wire A, the spacing is s_default−4r, with the proximate wire a victim-aggressor wire VA, the spacing is s_default−5r+e.

If the first wire is a victim-aggressor wire VA and the proximate wire is a default wire D, the spacing is s_default−3r, with the proximate wire being a victim wire V, the spacing is s_default−4r+e, with the proximate wire an aggressor wire A, the spacing is s_default−5r+e, and with the proximate wire a victim-aggressor wire VA, the spacing is s_default−6r+e.

The approaches described in the embodiments can be modified to include additional classes of victim and aggressor nets and/or different wire widths.

The matrices of both tables in FIGS. 3 and 4, respectively, can be adapted to save additional wiring resources. Another improvement, additionally or alternatively, can be to add a weighing function to timing critical nets to avoid detours in important signals.

The IC design is characterized by the steps of
  defining sets of nets of different kinds, especially default nets, victim nets, aggressor nets, and victim-aggressor nets,
  perform global routing of the electronic circuit, for each net yielding an area which is a small subset of the entire chip area, where local routing can be performed,
  run a coupling analysis, in order to verify or falsify the coupling characteristics of the nets,
  assign wire types V, A, AV, D to the kinds of nets,
  perform local routing, in order to actually embed the wires and thus determine their location,
  run a coupling analysis based on the local routing results,
  assign wire types V, A, AV, D to the kinds of nets,
  rip-up and reroute possible new wire types V, A, AV, D, found in the coupling analysis, and allowing rip-up of others,
  repeat routing and assigning steps if necessary,
  reset wire widths to original widths if necessary,
  return from routing.

Figure 5:
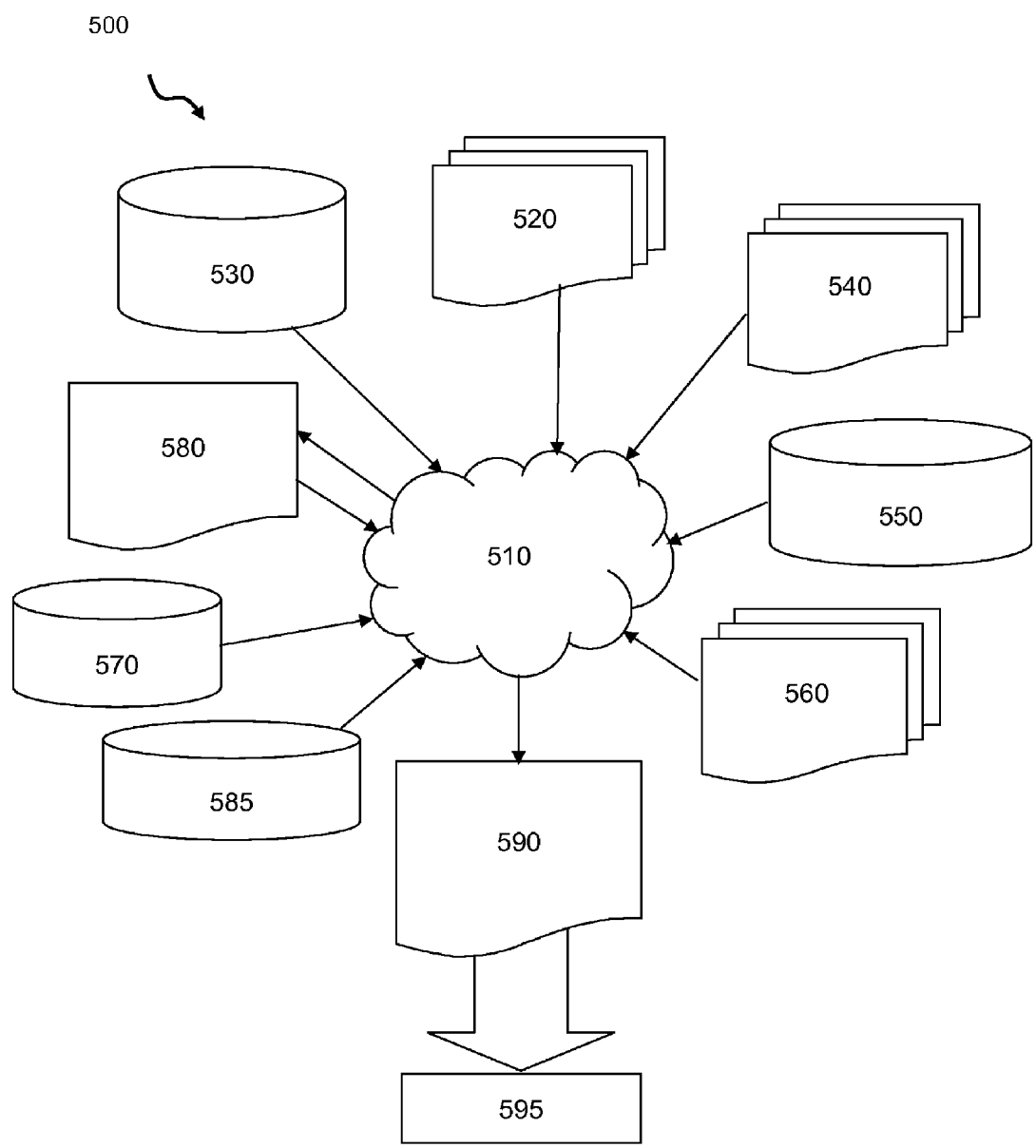
FIG. 5 a flow diagram of a design process used in semiconductor design, manufacturing, and/or test.

FIG. 5 shows a block diagram of an example design flow 500. Design flow 500 may vary depending on the type of integrated circuit (IC) being designed. For example, a design flow 500 for building an application specific IC (ASIC) may differ from a design flow 500 for designing a standard component. Design structure 520 is preferably an input to a design process 510 and may come from an IP provider, a core developer, or other design company or may be generated by the operator of the design flow, or from other sources. Design structure 520 comprises a circuit in the form of schematics or HDL, a hardware-description language (e.g., Verilog, VHDL, C, etc.).

Design structure 520 may be contained on one or more machine readable medium. For example, design structure 520 may be a text file or a graphical representation of the circuit. Design process 510 preferably synthesizes (or translates) the circuit into a netlist 580, where netlist 580 is, for example, a list of wires, transistors, logic gates, control circuits, I/O, models, etc. that describes the connections to other elements and circuits in an integrated circuit design and recorded on at least one of machine readable medium. This may be an iterative process in which netlist 580 is resynthesized one or more times depending on design specifications and parameters for the circuit.

Design process 510 may include using a variety of inputs; for example, inputs from library elements 530 which may house a set of commonly used elements, circuits, and devices, including models, layouts, and symbolic representations, for a given manufacturing technology (e.g., different technology nodes, 32 nm, 45 nm, 50 nm, etc.), design specifications 540, characterization data 550, verification data 560, design rules 570, and test data files 585 (which may include test patterns and other testing information). Design process 510 may further include, for example, standard circuit design processes such as timing analysis, verification, design rule checking, place and route operations, etc. One of ordinary skill in the art of integrated circuit design can appreciate the extent of possible electronic design automation tools and applications used in design process 510 without deviating from the scope and spirit of the invention. The design structure of the invention is not limited to any specific design flow.

Ultimately, design process 510 preferably translates the circuit, along with the rest of the integrated circuit design (if applicable), into a final design structure 590 (e.g., information stored in a GDS storage medium). Final design structure 590 may comprise information such as, for example, test data files, design content files, manufacturing data, layout parameters, wires, levels of metal, vias, shapes, test data, data for routing through the manufacturing line, and any other data required by a semiconductor manufacturer to produce the circuit. Final design structure 590 may then proceed to a stage 595 where, for example, final design structure 590: proceeds to tape-out, is released to manufacturing, is sent to another design house or is sent back to the customer.

The invention can take the form of an entirely hardware embodiment, an entirely software embodiment or an embodiment containing both hardware and software elements. In an embodiment, the invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

A computer processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

While a particular embodiment has been shown and described, various modifications of the present invention will be apparent to those skilled in the art.

The invention claimed is:

1. A computer-implemented routing method that reduces coupling between wires of an electronic circuit, said method comprises:
    classifying, by a computing device, sets of nets representing wires of said electronic circuit according to their coupling characteristics; and
    choosing, by said computing device, spacing between wires assigned to the sets of nets according to the coupling characteristics;
    applying, by said computing device, a first distance rule between a first wire and a second wire, which said second wire is adjacent to said first wire, unless:
        said first wire is a victim set wire type and said second wire is one of an aggressor set wire type and a victim aggressor set wire type, wherein a second distance rule is applied, or
        said first wire is an aggressor set wire type and said second wire is one of a victim set wire type and a victim aggressor set wire type, wherein said second distance rule is applied, or
        said first wire is a victim-aggressor set wire type and said second wire is one of a victim set wire type, an aggressor set wire type and a victim-aggressor set wire type, wherein said second distance rule is applied.

2. The computer-implemented method according to claim 1, further comprising:
    increasing spacing between adjacent wires to avoid coupling.

3. The computer-implemented method according to claim 2, wherein said classifying further comprises:
    classifying, by said computing device, at least one set of as a victim set wire type, which contains nets that are classified victims to one or more coupling issues: and
    classifying, by said computing device, at least one set of nets as an aggressor set wire type, which contains nets that are classified aggressors of one or more coupling issues; and
    applying, by said computing device, specific distance rules to the different sets of nets.

4. The computer-implemented method according to claim 3, further comprising:
    classifying, by said computing device, at least one set of nets as a victim aggressor set wire type, which contains nets that are classified victims and aggressors of one or more coupling issues; and
    classifying, by said computing device, at least one set of nets as a default set wire type, which contains nets which are insensitive to coupling issues.

5. The computer-implemented method according to claim 4, further comprising:
    assigning, by said computing device, one of said specific wire types to a specific set of nets to implement the set of nets in a lay-out of said electronic circuit.

6. The computer-implemented method according to claim 5, further comprising:
    choosing, by said computing device, said spacing between adjacent wires depending on said adjacent wires specific wire types.

7. The computer-implemented method according to claim 1, wherein with the first distance rule a minimum space is chosen as a first spacing.

8. The computer-implemented method according to claim 7, wherein with the second distance rule an extra space is added to the first spacing yielding a second spacing.

9. The computer-implemented method according to claim 1, wherein wire widths are assigned to at least two of set wire types, wherein the widths are representative for each specific set wire type.

10. The computer-implemented method according to claim 9, wherein the widths for said set wire types increase in the same order as a spacing requirement decreases between wires of the same set wire type, yielding constant wire pitches of the set wire types for routing.

11. The computer-implemented method according to claim 10, wherein the wire widths increase by an even numbered multiple of a router resolution.

12. The computer-implemented method according to claim 11, wherein the spacing requirement decreases by an even-numbered multiple of a router resolution.

13. The computer-implemented method according to claim 12, wherein the widths increase from default set wire type to victim set wire type to aggressor set wire type to victim-aggressor set wire type types.

14. The computer-implemented method according to claim 13, wherein the spacing requirement decreases from default set wire type to victim set wire type to aggressor set wire type to victim aggressor set wire type.

15. The computer-implemented method according to claim 14, wherein with the first distance rule a wire spacing is decreasing in units of the router resolution.

16. The computer-implemented method according to claim 15, wherein with the second distance rule an additional spacing is added to the first wire spacing.

17. The computer-implemented method according to claim 16, wherein additional types of victim and aggressor nets are included.

18. The computer-implemented method according to claim 17, wherein a weighing function is applied to at least one timing critical net.

19. The computer-implemented method according to claim 18, further comprising at least one of:
    defining sets of nets of different kinds;
    performing global routing of the electronic circuit;
    running a coupling analysis;
    assigning wire types to the kinds of nets;
    performing local routing;
    running a coupling analysis based on the local routing results;
    assigning wire types to the kinds of nets;
    ripping-up and rerouting new wire types, allowing rip-up of others;
    repeating routing and assigning steps if necessary;
    resetting wire widths to original widths if necessary; and
    returning from routing.

* * * * *